United States Patent
Niemann et al.

(10) Patent No.: US 9,518,883 B2
(45) Date of Patent: Dec. 13, 2016

(54) FLUID PRESSURE SENSOR

(71) Applicant: Hella KGaA Hueck & Co., Lippstadt (DE)

(72) Inventors: Thomas Niemann, Delmenhorst (DE); Jurgen Palloks, Westerstede (DE)

(73) Assignee: HELLA KGAA HUECK & CO., Lippstadt (DE)

( * ) Notice: Subject to any disclaimer, the term of this patent is extended or adjusted under 35 U.S.C. 154(b) by 102 days.

(21) Appl. No.: 14/157,035

(22) Filed: Jan. 16, 2014

(65) Prior Publication Data

US 2014/0202255 A1    Jul. 24, 2014

(30) Foreign Application Priority Data

Jan. 24, 2013    (DE) .................. 10 2013 001 159

(51) Int. Cl.
  *G01L 9/00*    (2006.01)
  *G01L 9/08*    (2006.01)
  *G01L 19/14*   (2006.01)

(52) U.S. Cl.
  CPC ............... *G01L 9/08* (2013.01); *G01L 9/008* (2013.01); *G01L 9/0052* (2013.01); *G01L 19/141* (2013.01)

(58) Field of Classification Search
  CPC ................................ G01L 9/08; G01L 19/141
  USPC ........................................................ 73/753
  See application file for complete search history.

(56) References Cited

U.S. PATENT DOCUMENTS

| | | | |
|---|---|---|---|
| 4,796,464 A * | 1/1989 | Miller | G01L 19/14 439/353 |
| 5,014,557 A * | 5/1991 | Lawless | G01L 19/143 73/431 |
| 6,201,467 B1 * | 3/2001 | Winterer et al. | 338/42 |
| 6,346,742 B1 * | 2/2002 | Bryzek et al. | 257/704 |
| 7,363,819 B2 * | 4/2008 | Mast et al. | 73/754 |
| 2003/0094050 A1 * | 5/2003 | Miyazaki et al. | 73/753 |

FOREIGN PATENT DOCUMENTS

| | | |
|---|---|---|
| DE | 42 05 264 A1 | 8/1993 |
| DE | 10 2004 029 084 A1 | 1/2006 |
| DE | 10 2008 017 871 A1 | 11/2009 |
| DE | 10 2009 038 706 A1 | 3/2010 |
| DE | 10 2008 042 489 A1 | 4/2010 |
| DE | 10 2011 083 174 A1 | 3/2013 |

* cited by examiner

*Primary Examiner* — Lisa Caputo
*Assistant Examiner* — Roger Hernandez-Prewit
(74) *Attorney, Agent, or Firm* — Muncy, Geissler, Olds & Lowe, P.C.

(57) ABSTRACT

In a fluid pressure sensor with a pressure sensing membrane and an electronic circuit, the electronic circuit is in a section realized so thin that a membrane is formed in this section of the electronic circuit. In the other sections, the electronic circuit is realized thicker than in the section that forms the membrane. This makes it possible to manufacture a particularly compact fluid pressure sensor.

5 Claims, 3 Drawing Sheets

FLUID PRESSURE SENSOR

BACKGROUND

Field of the Invention

The invention pertains to a fluid pressure sensor with a pressure sensing membrane and with an electronic circuit, wherein the electronic circuit is in a section realized so thin that this section of the electronic circuit forms the membrane, and wherein the electronic circuit is in other sections realized thicker than in the section that forms the membrane.

Description of Related Art

Sensors of this type are known from the prior art and also used for sensing the pressure of aggressive fluids such as, for example, motor oil.

DE 10 2008 017 871 A1 discloses a pressure sensor module that has a microelectronic design and features a pressure cell and an electronic circuit on a circuit board.

DE 10 2009 038 706 A1 discloses a pressure sensor with a membrane that is arranged in a moulded part and forms a section that is thinner than the remaining sections of the moulded part. Other pressure sensors with similarly designed membranes are known from DE 10 2008 042 489 A1 and DE 10 2004 029 084 A1.

The invention is based on the objective of developing a fluid pressure sensor of the initially cited type that has a particularly compact design.

SUMMARY

This objective is attained by means of a fluid pressure sensor with the characteristics of claim 1. Advantageous embodiments of the invention are disclosed in the dependent claims.

In a fluid pressure sensor with a pressure sensing membrane and an electronic circuit, in which the electronic circuit is in a section realized so thin that this section of the electronic circuit forms the membrane while adjacent sections of the electronic circuit are realized thicker, it is proposed, according to the invention, that a reference chamber is arranged on the electronic circuit above the section that forms the membrane, that the electronic circuit and the reference chamber are completely enclosed by a thermoplastic except for the section, in which the membrane is realized, and that the thermoplastic directly abuts on a housing.

A fluid pressure sensor of this type makes it possible to manufacture a particularly compact sensor. The electronic circuit designed and intended for controlling and/or evaluating the data acquired by the fluid pressure sensor simultaneously contains the membrane. This electronic circuit preferably consists of a microelectronic circuit or a so-called application-specific integrated circuit or ASIC. The circuit is adapted in such a way that the membrane is realized in one section. If the membrane extends over the entire width of the electronic circuit, the electronic circuit is only realized thicker on the two opposite sides, but it is preferred that the membrane does not extend over the entire width of the electronic circuit, i.e. the circuit is realized thicker all around the section that forms the membrane. This not only serves for achieving a higher stability, but also for providing the required layers for the realization of the application-specific integrated circuit.

In this case, the fluid pressure sensor is preferably realized in such a way that the electronic circuit features a recess on the side that faces the fluid to be sensed, and that the membrane is realized in the region of this recess. The rear side of the electronic circuit, i.e. the side that faces away from the fluid to be sensed, is preferably realized plane in this case. However, a reversed design would, in principle, also be conceivable, wherein the plane side would in this case lie on the side facing the fluid to be sensed. It would furthermore be conceivable to realize the membrane at approximately half the height of the electronic circuit. This would mean that recesses are provided from both sides of the electronic circuit, and that these recesses reduce the thickness of a section of the electronic circuit to such a degree that a membrane is formed.

The thickness of the membrane depends on the material on the one hand and on the size of the membrane on the other hand. With consideration of the material thickness and the size of the membrane, the overall thickness of this membrane needs to be so thin that a pressure-induced deformation of the membrane can take place. The membrane is impermeable to the fluids and characterized, in particular, in that it deforms under pressure.

In another preferred embodiment, the electronic circuit features a leadframe on the side that faces the fluid to be sensed. In this case, the leadframe is preferably arranged directly adjacent to the electronic circuit. The leadframe and an opening in the leadframe that is tapered toward the membrane and behind which a recess is provided in the electronic circuit face the fluid to be sensed.

The reference chamber is advantageously arranged on the side of the electronic circuit that faces away from the fluid to be sensed. The reference chamber preferably consists of glass or of silicone. During the manufacture, air with ambient pressure, preferably a defined pressure, e.g., of 1 bar, was enclosed in the reference chamber. This makes it possible, in particular, to cover the low-pressure range up to 5 bar. The reference pressure to be realized in the reference chamber depends on the intended use and the planned measuring range of the fluid pressure sensor. The deformation of the membrane therefore depends on the differential pressure between two sides of the membrane. In the present example, the reference chamber simultaneously has the function of additionally supporting the electronic circuit, particularly the membrane, because the reference chamber is realized in a cover-like fashion and completely surrounds the section that is realized so thin that it forms the membrane on its edge regions. The membrane is therefore surrounded by a cover that defines the dimensions of the reference chamber and is attached onto the electronic circuit with its edges. The cover is preferably attached on or onto the region of the electronic circuit that on the opposite side lies in the region of a recess, in which the membrane is realized. In this case, the recess is preferably larger than the membrane because the entire recess is preferably realized in a funnel-like fashion and does not have any walls that extend perpendicular to the surface of the electronic circuit. The cover in this case covers a surface that is larger than the thinner region that forms the membrane, but smaller than the region of the recess, in which the membrane is realized.

In this case, the electronic circuit, the reference chamber and preferably also the circuit board or leadframe are completely enclosed by an injection-moulded thermoplastic except for the section of the electronic circuit, in which the membrane is realized. In this way, the electronic circuit and the other functional components are sealed relative to the medium to the greatest possible extent. It is therefore also possible to sense the pressure of extremely aggressive mediums. A thusly designed fluid pressure sensor is suitable for measuring motor oil, fuel, fluids for air-conditioning systems and other fluids. The described fluid pressure sensor can, in principle, be used for all fluids used in a motor vehicle.

In this case, the electronic circuit is realized mirror-symmetrical referred to a perpendicular through the center of the membrane and arranged in the thermoplastic. Such a symmetrical design of preferably the entire fluid pressure sensor including circuit board, electronic circuit, reference chamber, thermoplastic and housing also results in a particularly sound force distribution.

A measuring device for measuring the intensity of the deformation of the membrane is preferably arranged within the reference chamber. It may consist of a piezoresistive pressure sensor, in which electric resistors are applied onto the membrane. An electric voltage is then generated due to a pressure-dependent deformation. However, it would also be possible to utilize a piezoelectric pressure sensor, in which an electric voltage is generated under pressure in a crystal. It would also be possible, in principle, to utilize other types of sensors.

The thermoplastic furthermore directly abuts on a housing. The thermoplastic and the housing are components of the fluid pressure sensor. The housing is preferably cylindrical and provided with a thread. The fluid pressure sensor can be directly screwed into correspondingly prepared threaded openings with a housing of this type such that the fluid pressure sensor then either senses an oil pressure or a fuel pressure or the like depending on the line or the container, to which the fluid pressure sensor is attached. The housing is comparatively small and adapted to the size of the electronic circuit. The length of the electronic circuit, in particular, is greater than 50% of the inside diameter of the housing. Another aspect consists of making available a motor vehicle with a component, through which a fluid flows, such as an oil passage or a fuel line, on which a fluid pressure sensor of the above-described type is arranged.

DETAILED DESCRIPTION OF EXEMPLARY EMBODIMENTS

Figure 1:
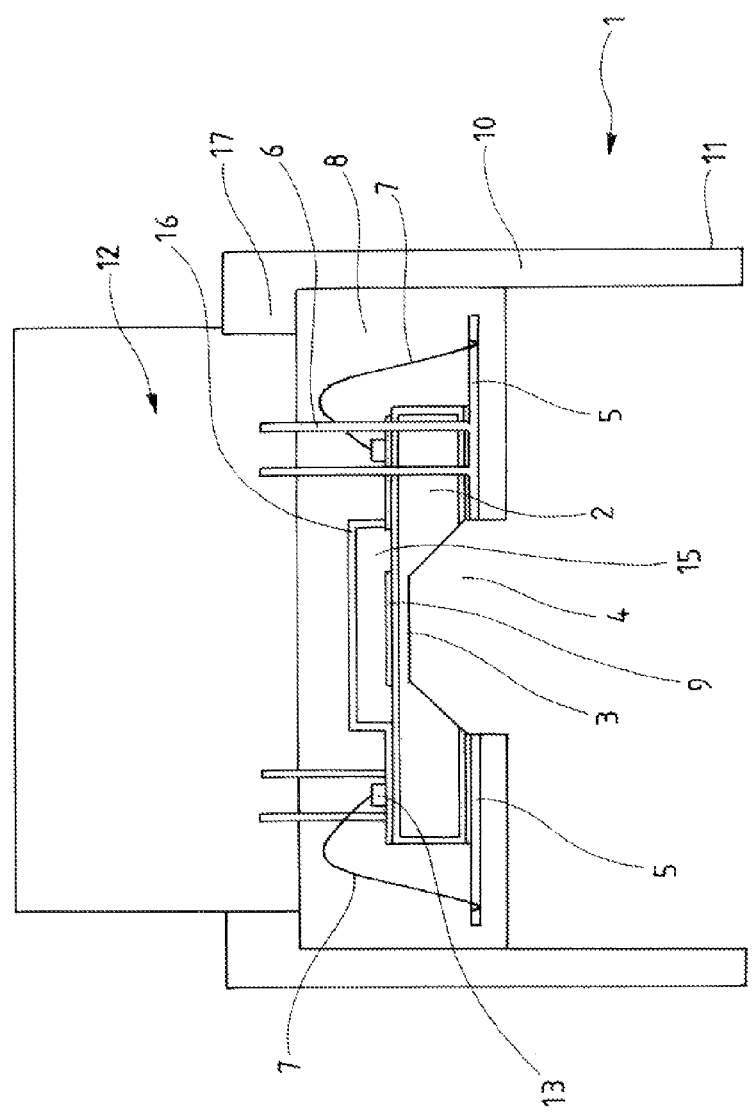
FIG. 1 is a cross-sectional view of a fluid pressure sensor according to an embodiment of the present application.
Figure 2:
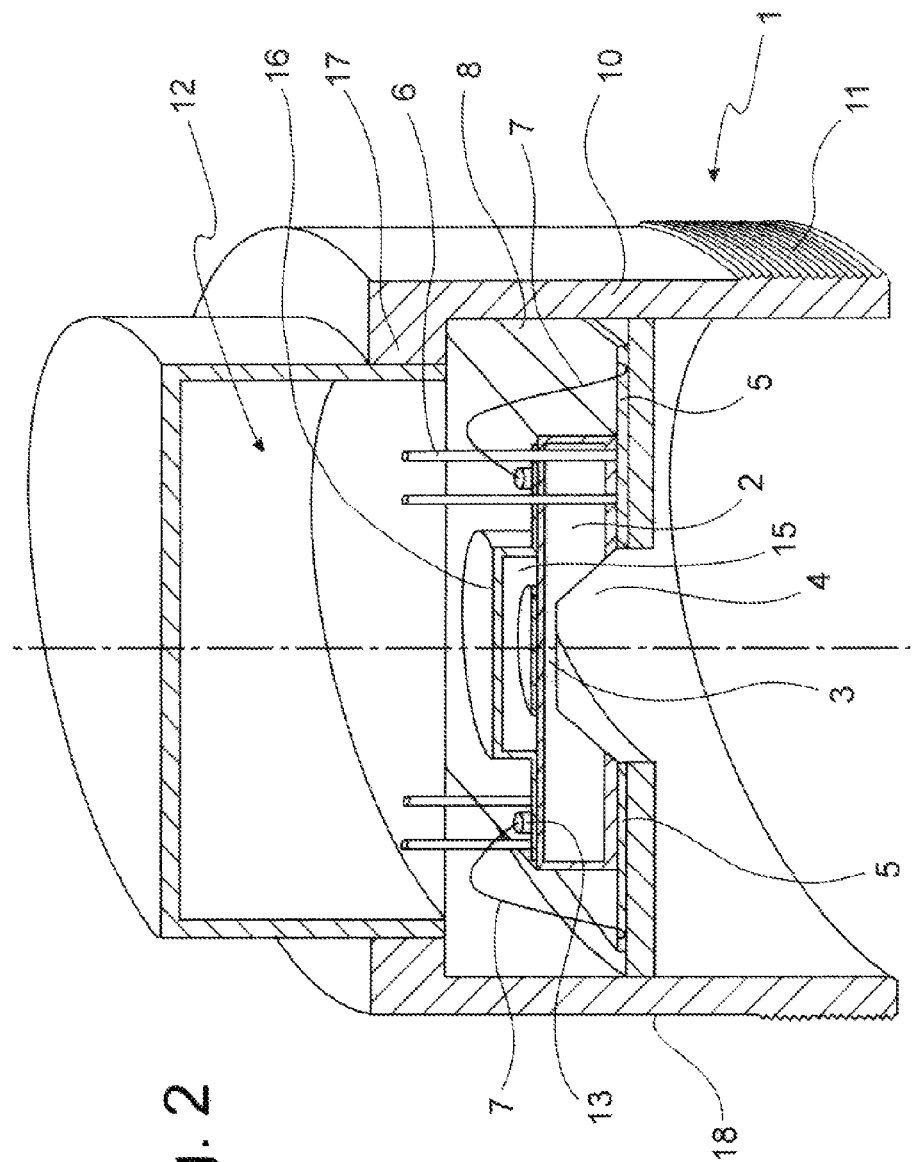
FIG. 2 is a perspective cross-sectional view of the fluid pressure sensor shown in FIG. 1.

A preferred exemplary embodiment of the invention is described in greater detail below with reference to the figures. FIGS. 1 and 2 show a schematic cross section through an inventive fluid pressure sensor.

Figure 3:
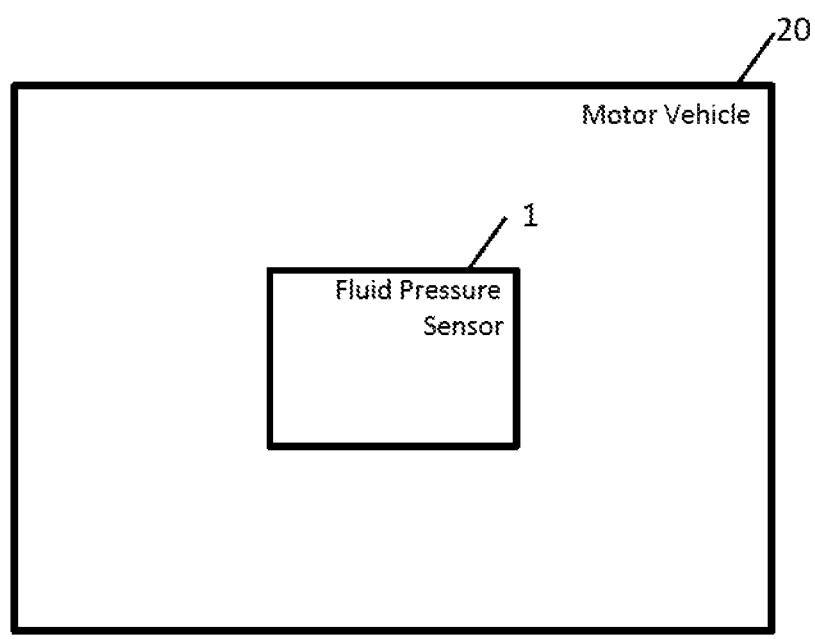
FIG. 3 is a motor vehicle including a fluid pressure sensor according to an embodiment of the present application.

FIGS. 1 and 2 show a fluid pressure sensor 1, in the center of which an electronic circuit 2 is arranged. As shown in FIG. 3, the fluid pressure sensor 1 may be installed in a motor vehicle 20. This electronic circuit is realized in the form of an ASIC and features a central recess 4. In the region of this recess 4, the thickness of a section of the electronic circuit 2 is reduced to such a degree that a membrane 3 is formed. In FIGS. 1 and 2, the fluid to be sensed would be situated in the lower portion and reach the membrane 3 via the recess 4. The recess 4 is therefore arranged on the side that faces the fluid to be sensed. The electronic circuit 2 is realized plane on the side of the electronic circuit 2 that faces away from the fluid to be sensed. At this location, the membrane 3 therefore ends flush with the remaining surface of the electronic circuit 2. Control and evaluation circuits for operating the fluid pressure sensor 1 are integrated into the electronic circuit 2. The electronic circuit 2 is realized in the form of an ASIC. A sensor element 9 arranged on the electronic circuit 2 registers the degree of deformation of the membrane 3. The sensor element may consist, for example, of a piezoelectric sensor or a piezoresistive sensor. A cover 16 is arranged above the membrane 3 and attached onto the surface of the electronic circuit 2 in a sealed fashion such that a reference chamber 15 is realized in the thusly created cavity. The dimensions of the cover 16 approximately correspond to the dimensions of the recess 4 on the opposite side. The cover 16 and the hollow chamber 15 created thereunder stabilize the membrane 3 from above. The electronic circuit 2 is realized on a leadframe 5 that is also referred to as a circuit board. The electronic circuit 2 therefore is in direct contact with the leadframe 5. Contacts 6 originating from the leadframe 5 externally lead past the electronic circuit 2 and upward to a terminal plug 12 on the rear side of the fluid pressure sensor. Contacts between the leadframe 5 and the upper side of the electronic circuit 2, particularly terminals 13 provided at this location, are also realized by means of bonding wires 7. The electronic circuit 2, the leadframe 5, on which the electronic circuit 2 is realized, and the reference chamber 15 situated on top of the electronic circuit are completely enclosed by a thermoplastic 8. The only exception is the region of the recess 4. All metallic contacts and strip conductors are arranged within the thermoplastic 8 and not in contact with the medium or the fluid to be sensed, respectively. This also makes it possible to utilize the fluid pressure sensor in aggressive mediums. The fluid pressure sensor furthermore features a housing 10 that is open toward the front and features an external thread 11 in its front region. This external thread makes it possible, for example, to screw the fluid pressure sensor 1 to an oil passage or a fuel line. The housing 10 and the terminal plug 12 attached to the rear side of the housing 10 are universally dimensioned. The desired interfaces can be individually adapted in the terminal plug 12. The thermoplastic 8 is realized such that it flushly abuts on the sides of the housing 10. The thermoplastic 8 is furthermore dimensioned and inserted into the housing 10 in such a way that it flushly abuts on a bottom region 17 of the housing 10. In this way, the thermoplastic 8 and therefore also the electronic circuit 2 and the membrane 3 accommodated therein are supported on the housing 10 and, in particular, on the bottom region 17 of the housing 10 by means of the thermoplastic 8.

The invention claimed is:

1. A fluid pressure sensor with a pressure sensing membrane and an electronic circuit, wherein the electronic circuit is in a section realized so thin that this section of the electronic circuit forms the membrane, and wherein the electronic circuit is in other sections realized thicker than in the section that forms the membrane, wherein a reference chamber is arranged on the electronic circuit above the section that forms the membrane, the electronic circuit and the reference chamber are completely enclosed by a thermoplastic except for the section, in which the membrane is realized, and the thermoplastic directly abuts on a housing, the housing is cylindrical, the housing has an outer circumferential wall with a constant outer diameter throughout the entire axial length of the housing and a thread for attaching the fluid pressure sensor formed on the outer circumferential wall, a length of the electronic circuit is larger than 50% of an inside diameter of the housing, in which the electronic circuit is accommodated, and the electronic circuit and the reference chamber are entirely accommodated in the housing.

2. The fluid pressure sensor according to claim 1, wherein the electronic circuit features a recess on a side that faces fluid to be sensed, and the membrane is realized in the region of this recess.

3. The fluid pressure sensor according to claim 1, wherein the electronic circuit is connected to a leadframe on a side that faces fluid to be sensed.

4. The fluid pressure sensor according to claim 1, wherein the electronic circuit is arranged in the thermoplastic mirror symmetrically referred to a perpendicular through the center of the membrane perpendicular to a center axis of the cylindrical body of the housing.

5. A motor vehicle with the fluid pressure sensor according to claim 1 and a component, through which a fluid flows, a pressure of the fluid being detected by the fluid pressure sensor.

* * * * *